United States Patent
Gross et al.

(10) Patent No.: US 7,283,919 B2
(45) Date of Patent: Oct. 16, 2007

(54) DETERMINING THE QUALITY AND RELIABILITY OF A COMPONENT BY MONITORING DYNAMIC VARIABLES

(75) Inventors: Kenny C. Gross, San Diego, CA (US); Dan Vacar, San Diego, CA (US); Leoncio D. Lopez, Escondido, CA (US); David K. McElfresh, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/369,293

(22) Filed: Mar. 6, 2006

(65) Prior Publication Data

US 2007/0208538 A1    Sep. 6, 2007

(51) Int. Cl.
*G01R 27/28* (2006.01)
(52) U.S. Cl. .................. 702/118; 702/182; 702/183
(58) Field of Classification Search .................. 702/118
See application file for complete search history.

(56) References Cited

U.S. PATENT DOCUMENTS

| 4,937,763 A | 6/1990 | Mott | 364/550 |
| 6,229,329 B1* | 5/2001 | Nakata et al. | 324/765 |
| 6,782,500 B1* | 8/2004 | Madge et al. | 714/738 |

* cited by examiner

*Primary Examiner*—Hal Wachsman
*Assistant Examiner*—Stephen J. Cherry
(74) *Attorney, Agent, or Firm*—Park, Vaughan & Fleming LLP

(57) ABSTRACT

One embodiment of the present invention provides a system that tests the quality and/or the reliability of a component. During operation, the system applies test conditions to a plurality of specimens of the component. While applying the test conditions, the system measures the same variable from each of the plurality of specimens. Next, the system computes a running average of the measured variable across the plurality of specimens. The system then computes residuals between the measured variable for each specimen and the running average. The system next determines from the residuals whether the associated specimens are degraded.

15 Claims, 3 Drawing Sheets

DETERMINING THE QUALITY AND RELIABILITY OF A COMPONENT BY MONITORING DYNAMIC VARIABLES

RELATED APPLICATION

The subject matter of this application is related to the subject matter in a co-pending non-provisional application by the same inventors as the instant application entitled, "Detecting Degradation of Components during Reliability-Evaluation Studies," having Ser. No. 11/219,091, and filing date 1 Sep. 2005.

BACKGROUND

1. Field of the Invention

The present invention relates to techniques for determining the quality and/or the reliability of a component in a system. More specifically, the present invention relates to a method and apparatus for determining the quality and/or the reliability of a component by monitoring dynamic variables associated with the component during an in-situ stress-test of the component.

2. Related Art

Computer system manufacturers routinely evaluate the quality and/or the reliability of individual computer system components to ensure that the computer systems manufactured from the components meet or exceed quality and reliability requirements of their customers. Typically, component reliabilities are determined through "reliability-evaluation studies." These reliability-evaluation studies can include "accelerated-life studies," which accelerate the failure mechanisms of a component, or "repair-center reliability evaluations," wherein the vendor tests components returned from the field. On the other hand, the quality of components is determined through "burn-in screens," which are designed to eliminate early failures prior to shipping to customers. These types of tests typically involve using environmental stress-test chambers to hold and/or cycle one or more stress variables (e.g. temperature, humidity, radiation, etc.) at levels that are believed to accelerate subtle failure mechanisms within a component. The components under test are then placed inside the stress-test chamber and subjected to those stress conditions.

Note that during a reliability-evaluation, even when subjected to the stress conditions, the components typically need to remain in the stress-test chambers for long time periods, which may range from hours to months, before failures are detected. Furthermore, it is usually not possible to apply pass/fail tests for the components or systems while they are in the stress-test chambers. Consequently, at predetermined time intervals, the components or systems under stress-test are typically removed from the stress-test chambers and are tested externally (referred to as "ex-situ" tests) to count the number of components that have failed. The components or systems that have not failed are then returned to the stress-test chambers and are tested further. In this way, the reliability-evaluation study generates a history of failed and not-failed component/system counts at discrete intervals, e.g. 100 hours, 200 hours, 300 hours and so on.

Unfortunately, these ex-situ reliability-evaluation studies which use stress-test chambers are both expensive and time-consuming. This is a consequence of the fact that most reliability-evaluation studies have to deal with a tradeoff between the number of units being stress-tested, and the time they remain under stress-test. More specifically, if the components are expensive and/or in very short supply (e.g. pre-manufacturing prototype components) so that only a few components can be stress-tested, then extremely long test windows are needed to get a statistically significant number of failures in order to draw meaningful conclusions for reliability. On the other hand, if the components are inexpensive and readily obtainable, so that a large number of units can be placed under a stress-test, when the stress-test is halted to evaluate how many units have failed (which involves measuring every unit under test), the ex-situ evaluation becomes extremely resource-intensive and consequently expensive.

One solution to the above-described problems is to test and evaluate component reliabilities while the components are under stress in the stress-test chamber. This requires the ability to monitor specific physical variables which indicate the health of the components and which can be obtained directly from the components under test. However, a primary challenge in effectively performing this type of reliability-evaluation technique is to come up with a way to precisely detect when a component is degrading under stress conditions. Co-pending patent application Ser. No. 11/219,091 (listed above) applies a Sequential Probability Ratio Test (SPRT) to those physical variables under surveillance. This technique can accurately identify the incipience or onset of gradual component degradation when the monitored variables are relatively stationary (in the statistical sense) with time.

Unfortunately, for many reliability studies, the telemetry signals from the stress-test chamber contain significant dynamic behavior. This can occur, for example, in accelerated-life studies if the system is actively varying one or more stress variables, causing the stress variables to introduce dynamics into the telemetry metrics. The dynamic behavior also occurs in the early failure rate studies, burn-in screens and repair-center reliability evaluations. In these cases, the telemetry signals cannot be assumed to be stationary. Hence, the stationarity assumption, which is important for the SPRT technique to operate correctly, may be invalid.

Hence, what is needed is a method and apparatus for detecting degradation in a component under test by monitoring telemetry signals which exhibits dynamical behaviors.

SUMMARY

One embodiment of the present invention provides a system that tests the quality and/or the reliability of a component. During operation, the system applies test conditions to a plurality of specimens of the component. While applying the test conditions, the system measures the same variable from each of the plurality of specimens. Next, the system computes a running average of the measured variable across the plurality of specimens. The system then computes residuals between the measured variable for each specimen and the running average. The system next determines from the residuals whether the associated specimens are degraded.

In a variation on this embodiment, the system determines from the residuals whether the associated specimens are degraded by comparing the residuals with a set of threshold limits.

In a variation on this embodiment, the system records the time at which the specimen of the component was determined to have degraded; and additionally determines how many test events have been repeated on the specimen of the component when the specimen of the component was determined to have degraded.

In a variation on this embodiment, the quality and/or the reliability test can be applied to: (1) an early failure rate test of the component; (2) a burn-in screen of the component; (3) an accelerated stress test of the component; and (4) a repair-center reliability evaluation of a returned component.

In a variation on this embodiment, parameters for the test conditions can specify: (1) temperature; (2) vibration; (3) voltage noise; (4) humidity; and (5) radiation.

In a variation on this embodiment, the quality and/or the reliability test is an in-situ test wherein the quality and/or the reliability of the component are determined based on a dynamic behavior in the measured variable of the component when the component is under the test conditions.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs), DVDs (digital versatile discs or digital video discs), or any device capable of storing data usable by a computer system.

In-Situ Quality and Reliability Testing

For components undergoing quality and reliability testing in a stress-test chamber, it is often desirable to supply power to the components under test while they are in the stress-test chambers. The use of such a quality or reliability test setup is commonly referred to as "in-situ" testing. During an in-situ testing, even though it may not be possible to apply full pass/fail functional testing to the components inside the stress-test chamber, subtle anomalies in the electrical behavior of the components can be detected by monitoring specific physical variables of the devices in the stress-test chamber. For example, subtle anomalies in the noise-signature data-series of the current to the component appear when the component degrades and/or fails. Although the current to the component is an indirect measurement of the health of the device, the current-noise data-series can be used as an "inferential variable" for high-resolution annunciation of the onset of degradation. In many cases, such an inferential variable carries information on the exact point of failure in time in the components undergoing in-situ testing. Note that the inferential variable which is used during the in-situ testing is not limited to "current" to the device, and can in general include any type of measurable physical parameters.

Figure 1:
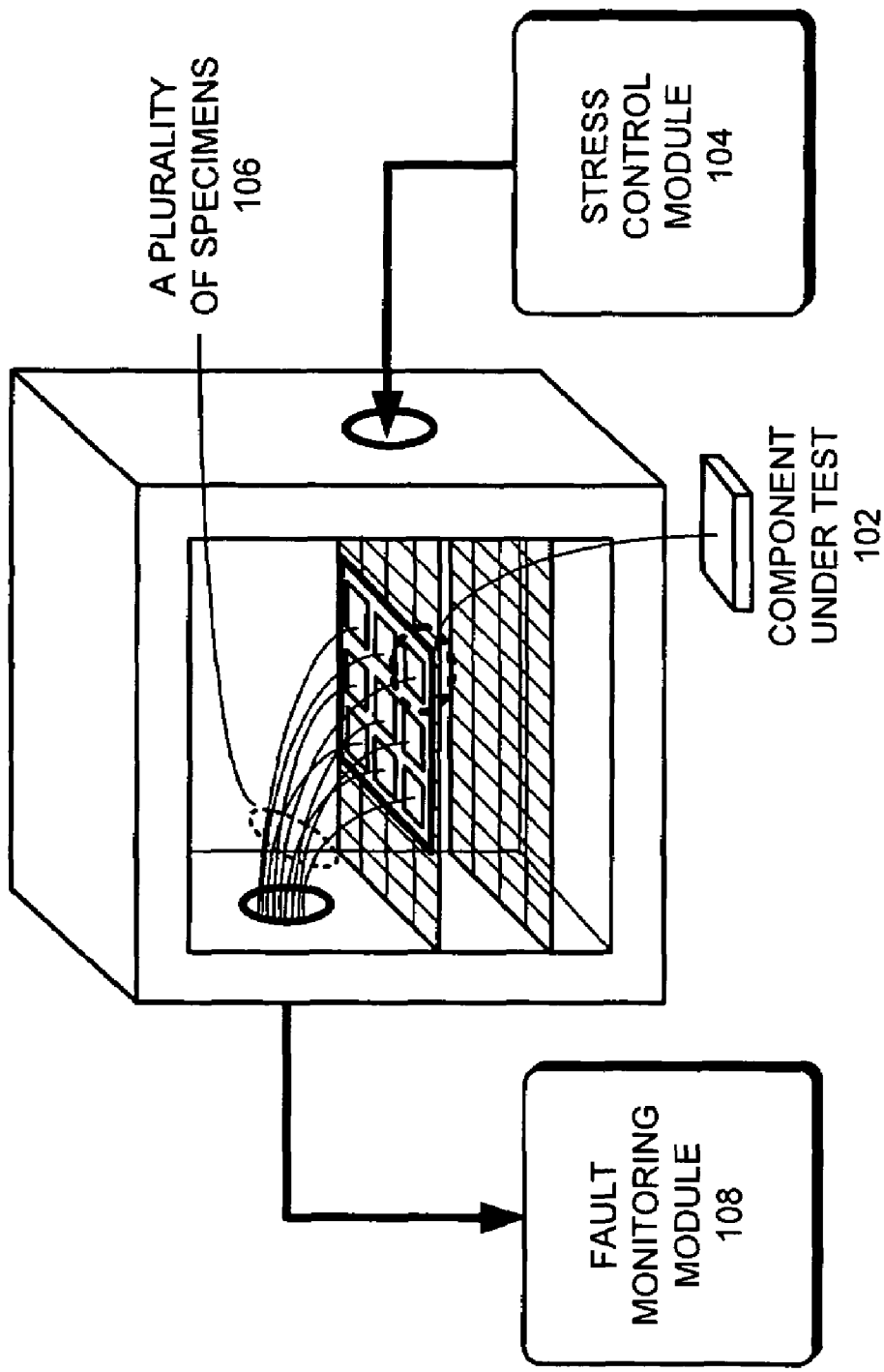
FIG. 1 illustrates an in-situ quality or reliability stress-test chamber in accordance with an embodiment of the present invention.

FIG. 1 illustrates an in-situ quality or reliability stress-test chamber 100 in accordance with an embodiment of the present invention. A component under test 102, which can be any type of device from a computer system, is placed inside stress-test chamber 100. Component under test 102 can include, but is not limited to: power supplies, capacitors, sockets, chips, and hard drives.

Stress control module 104 applies and controls one or more stress variables to the stress-test chamber 100. These stress variables can include, but are not limited to: temperature, humidity, vibration, voltage noise and radiation. In one embodiment of the present invention, stress control module 104 applies sufficient stress factors to stress-test chamber 100 to create accelerated-life studies for the component under test 102. The same setup can also be applied to early failure rate studies of a component, burn-in screens of a component and repair-center reliability evaluations of a returned component.

As is shown in FIG. 1, stress-test chamber 100 can contain multiple units (specimens) of component under test 102, wherein an array of nine specimens 106 of component under test 102 are shown. Stress-test chamber 100 provides a supply of power to each specimen of component under test 102, and obtains telemetry signal outputs (e.g., inferential variables) from each specimen. The telemetry signal outputs are coupled to a fault monitoring module 108. In one embodiment of the present invention, fault monitoring module 108 is a Continuous System Telemetry Harness (CSTH).

Note that the output data series can be either processed in real-time or post-processed. In one embodiment of the present invention, fault monitoring module 108 analyzes the output data series in real-time while the telemetry signals are being collected from all of the specimens 106 of component under test 102, and predicts the likelihood of failure for each of specimens 106. In another embodiment of the present invention, fault monitoring module 108 post-processes the output data series at a later time and detects whether failures have occurred at an earlier time, and if so, determines the time of failures. Note that the output data series can be but is not limited to: time-series, number of cycles, and number of incidents.

Note that the telemetry signal from each specimen of the component can include current, voltage, resistance, temperature, and other physical variables. Also note that all of the specimens 106 in stress-test chamber 100 can be tested at the same time and under the same conditions. Moreover, instead of testing multiple individual components, the stress-test chamber can be configured to test a single component.

Monitoring Dynamic Behaviors Using Multiple Specimens

Figure 2:
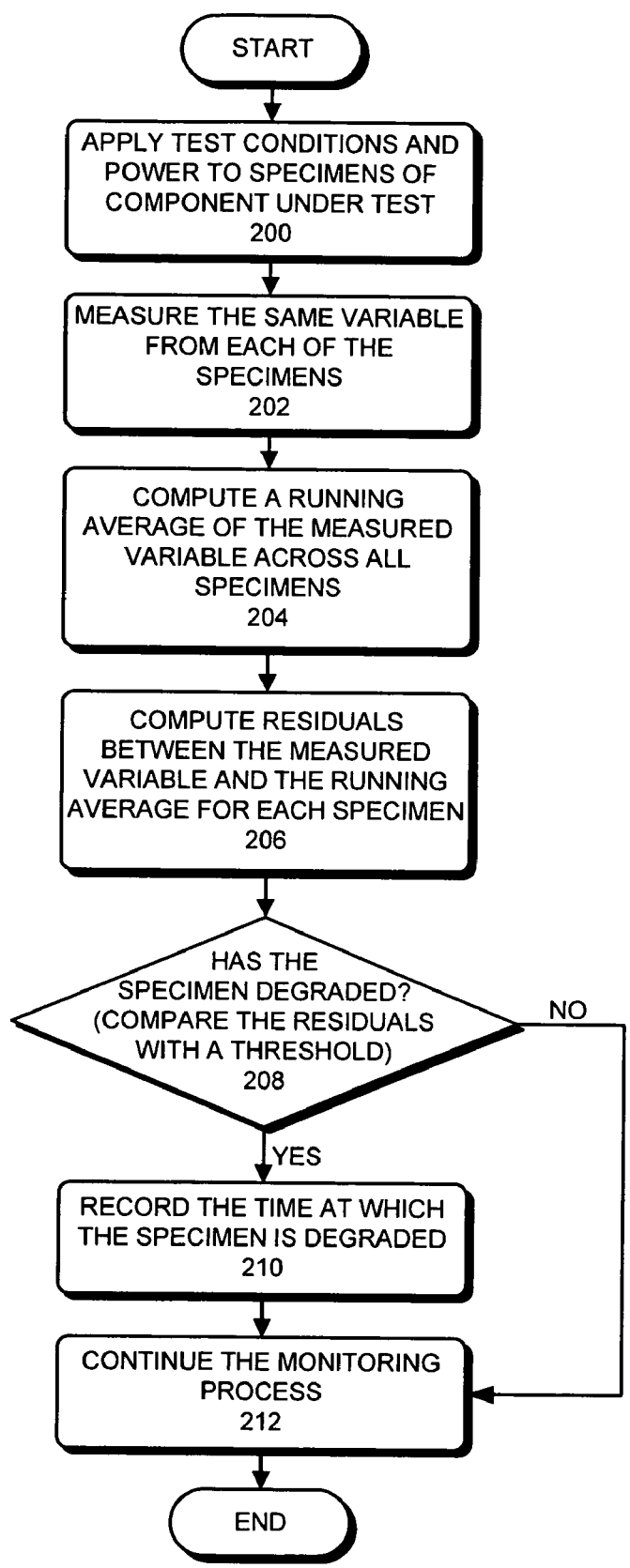
FIG. 2 presents a flowchart illustrating the process of monitoring the dynamic behavior of telemetry signals during a quality-testing or a reliability-evaluation of a component in accordance with an embodiment of the present invention.

FIG. 2 presents a flowchart illustrating the process of monitoring the dynamic behavior of telemetry signals during a quality-testing or a reliability-evaluation of a component in accordance with an embodiment of the present invention. Prior to the quality-testing or the reliability-evaluation, a plurality of specimens of the test component are placed inside a stress-test chamber. During operation, test conditions are applied to the plurality of specimens while they are supplied with power (step 200). Note that the test conditions comprise a set of stress parameters which can affect the health of the component. For example, these parameters can include but are not limited to: temperature, humidity, vibration, voltage noise, power surge, and radiation.

Next, while applying the test conditions and supplying the power, the system measures the same variable from each of the plurality of specimens (step 202). This variable can be, for example, current, voltage, resistance, temperature, and other physical or non-physical variables whose time-dependent behaviors can be used to infer the health of the specimens. The measured variable data series are then telemetered to fault monitoring module 108 for processing.

Next, the system computes a running average of the measured variable across the plurality of specimens (step 204). Note that the computed running average contains the common-mode behavior in the measured variable across the plurality of specimens, while the dynamic behavior in the measured variable associated with a specific specimen is suppressed. Also note that it is desirable to monitor a sufficient number of specimens to generate a running average that achieves above-described properties of the running average.

The system then computes residuals between the measured variable for each specimen and the computed running average (step 206). In so doing, the common-mode behavior among the plurality of specimens is removed from the measured variable for each specimen. Consequently, the residuals contain primarily the dynamic behaviors in the measured variable for each specimen. Note that the residuals are corresponding to the same time intervals used to compute the current running average.

Next, the system determines from the residuals whether the associated specimens have degraded (step 208). Note that anomalous behaviors in the measured variables often manifest themselves in dynamic behaviors such as spikes in the signals. These spikes remain in the residuals and can be detected simply by setting a threshold limit to the residuals. In one embodiment of the present invention, determining whether the specimens have degraded involves comparing the residuals of the specimens with a set of threshold limits. If the residuals are found to be greater than the threshold limits at a specific point of time, then an anomaly in the measured variable is inferred. Note that by placing the threshold limits on the residuals associated with each specimen, it becomes possible to catch subtle degradation in a specimen, even when the magnitude of the degradation (e.g. the magnitude of a spike) is smaller than the common-mode variation in the specimen's measured variable.

If degradations in the residuals are found in one or more specimens, the system records the exact times at which the specimens of the component were determined to have degraded based on the time stamps for the anomalies in the time series (step 210). Additionally, for certain quality-testing or reliability-evaluation, the system also determines how many test events have been repeated on a specimen when the specimen was determined to have degraded. For example, a switching device is often tested for its maximum number of lifetime switching operations before a functional degradation. As another example, a component is frequently tested under a cyclic condition, such as ramping the testing temperature up and down in controlled cycles. Note that both the time of degradation/failure and the number of cycles performed on the specimen towards its degradation/failure are extremely useful in revealing the underlying physics associated with the mode or modes of degradation/failure, which can lead to better understanding of degradation/failure mechanisms.

Next, the system continues the above-described monitoring and detecting process until the quality-testing or the reliability-evaluation is complete (step 212).

Note that the above-described quality or reliability test is an in-situ test, wherein the quality and reliability of the component are determined based on the dynamic behavior in the measured variable of the component when the component operates under stress conditions. Also note that steps 204, 206, 208 and 210 can be performed in either a real-time manner or a post-processing manner.

EXAMPLE

Figure 3:
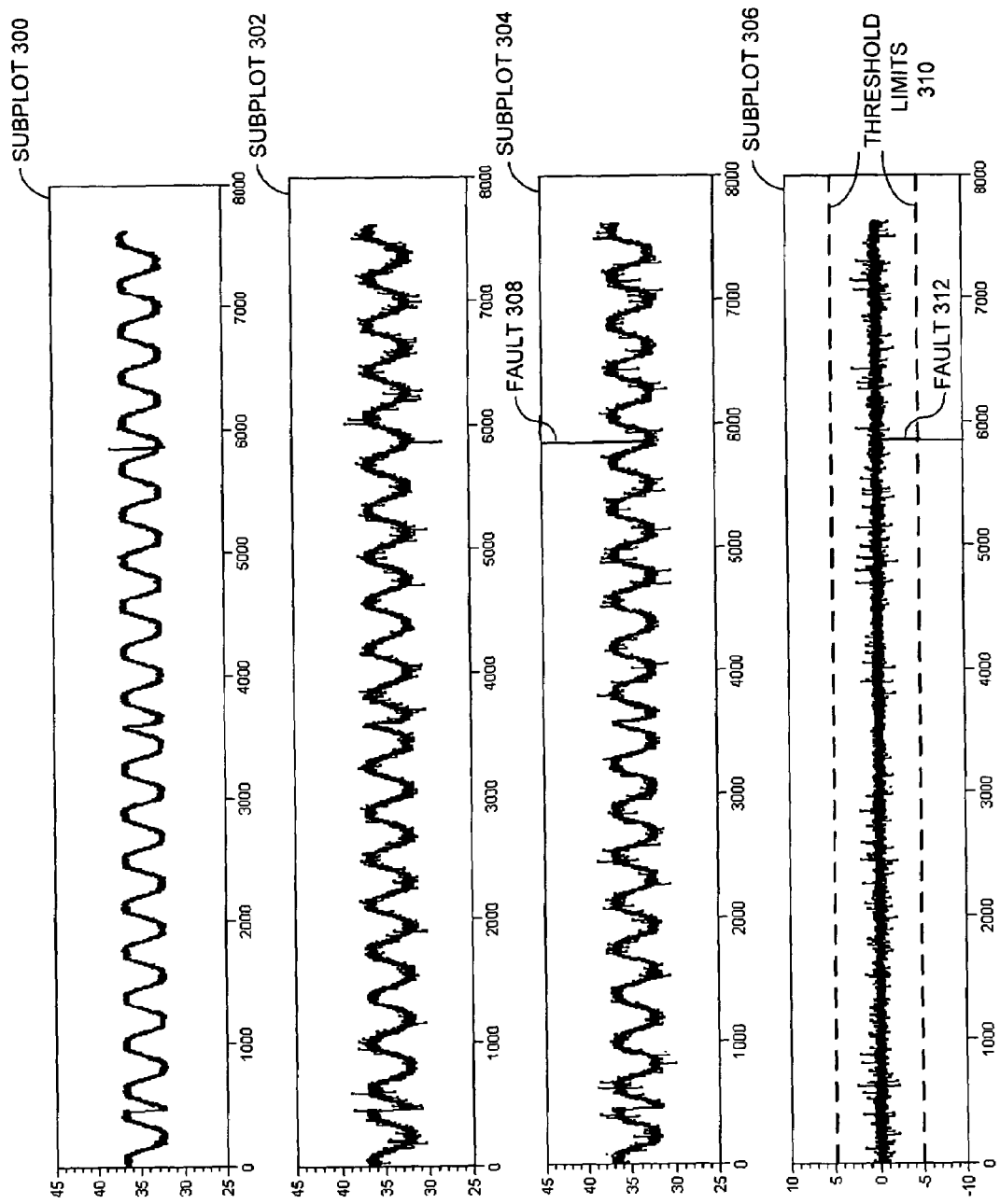
FIG. 3 illustrates an exemplary process for monitoring dynamic behaviors in telemetry signals using time-series in accordance with an embodiment of the present invention.

FIG. 3 illustrates an exemplary process for monitoring dynamic behaviors in telemetry signals using time-series in accordance with an embodiment of the present invention. In this example, the system simultaneously monitors seven specimens of a specific component and measures resistance values of the specimens as a function of time.

Note that there are four subplots 300, 302, 304, and 306 in FIG. 3. Within each subplot, the horizontal axis represents sample count in time-series order and the vertical axis represents resistance values in Ohms ($\Omega$). Subplot 300 in FIG. 3 illustrates the running average across all seven specimens. Subplot 302 illustrates a raw telemetry time-series for one of the seven specimens which experiences no degradation. Note that the measured time-series 302 shows a similar signal magnitude and an overall dynamic behavior as the running average 300, but has significantly more embedded noise-behavior.

Subplot 304 illustrates a raw telemetry time-series for another one of the seven specimens with a fault 308 presented as a spike in the time-series. Furthermore, subplot 306 illustrates the corresponding residuals for the raw telemetry time-series 304. Note that the dynamic components common to all seven specimens have been "filtered" out of the residuals 306. Consequently, the residuals 306 are primarily comprised of unique dynamic behaviors associated with each specific specimen.

The system then identifies faults in the specimens by setting a threshold limit on residuals 306. Note that because the range of average signal values is significantly reduced in residuals 306 from the raw signals 304, the system can use a much smaller threshold value than would be necessary for the raw-signal time-series, thereby facilitating identification of subtle incipient faults in components under test. For example, threshold limits 310 can be set around ±5$\Omega$ and can still detect fault 312 comfortably. Next, one can automatically record the exact time of the onset of a fault when the fault is found.

Note that the proposed invention allows the tradeoff between the number of units at test and the duration of the stress-test to be alleviated, while yielding much higher resolution information on the dynamic nature of the health of the components as a function of age and cumulative stress.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

The invention claimed is:

1. A method for testing the quality and/or the reliability of a component, comprising:
   applying test conditions to a plurality of specimens of the component;
   while applying the test conditions, measuring the same variable from each of the plurality of specimens;
   computing a running average of the measured variable across the plurality of specimens;
   computing residuals between the measured variable for each specimen and the running average;
   determining from the residuals whether the associated specimens are degraded;
   recording the time at which the specimen of the component was determined to have degraded; and
   determining how many test events have been repeated on the specimen of the component when the specimen of the component was determined to have degraded.

2. The method of claim 1, wherein determining from the residuals whether the associated specimens are degraded involves comparing the residuals with a set of threshold limits.

3. The method of claim 1, wherein the quality and/or the reliability test can be applied to:
   an early failure rate test of the component;
   a burn-in screen of the component;
   an accelerated stress test of the component; or
   a repair-center reliability evaluation of a returned component.

4. The method of claim 1, wherein parameters for the test conditions can specify:
   temperature;
   vibration;
   voltage noise;
   humidity; or
   radiation.

5. The method of claim 1, wherein the quality and/or the reliability test is an in-situ test wherein the quality and/or the reliability of the component is determined based on a dynamic behavior in the measured variable of the component when the component is under the test conditions.

6. A computer-readable storage medium storing instructions that when executed by a computer cause the computer to perform a method for testing the quality and/or the reliability of a component, the method comprising:
   applying test conditions to a plurality of specimens of the component;
   while applying the test conditions, measuring the same variable from each of the plurality of specimens;
   computing a running average of the measured variable across the plurality of specimens;
   computing residuals between the measured variable for each specimen and the running average;
   determining from the residuals whether the associated specimens are degraded;
   recording the time at which the specimen of the component was determined to have degraded; and
   determining how many test events have been repeated on the specimen of the component when the specimen of the component was determined to have degraded.

7. The computer-readable storage medium of claim 6, wherein determining from the residuals whether the associated specimens are degraded involves comparing the residuals with a set of threshold limits.

8. The computer-readable storage medium of claim 6, wherein the quality and/or the reliability test can be applied to:
   an early failure rate test of the component;
   a burn-in screen of the component;
   an accelerated stress test of the component; or
   a repair-center reliability evaluation of a returned component.

9. The computer-readable storage medium of claim 6, wherein parameters for the test conditions can specify:
   temperature;
   vibration;
   voltage noise;
   humidity; or
   radiation.

10. The computer-readable storage medium of claim 6, wherein the quality and/or the reliability test is an in-situ test wherein the quality and/or the reliability of the component is determined based on a dynamic behavior in the measured variable of the component when the component is under the test conditions.

11. An apparatus that tests the quality and/or the reliability of a component, comprising:
    an applying mechanism configured to apply test conditions to a plurality of specimens of the component;
    a measurement mechanism configured to measure the same variable from each of the plurality of specimens while the test conditions are applied;
    an average-computing mechanism configured to compute a running average of the measured variable across the plurality of specimens;
    an residuals-computing mechanism configured to compute residuals between the measured variable for each specimen and the running average;
    a determination mechanism configured to determine from the residuals whether the associated specimens are degraded;
    a recording mechanism configured to record the time at which the specimen of the component was determined to have degraded; and
    a determination mechanism configured to determine how many test events have been repeated on the specimen of the component when the specimen of the component was determined to have degraded.

12. The apparatus of claim 11, wherein while determining from the residuals whether the associated specimens are degraded the determination mechanism is configured to compare the residuals with a set of threshold limits.

13. The apparatus of claim 11, wherein the quality and/or the reliability test can be applied to:
    an early failure rate test of the component;
    a burn-in screen of the component;
    an accelerated stress test of the component; or
    a repair-center reliability evaluation of a returned component.

14. The apparatus of claim 11, wherein parameters for the test conditions can specify:
    temperature;
    vibration;
    voltage noise;
    humidity; or
    radiation.

15. The apparatus of claim 11, wherein the quality and/or the reliability test is an in-situ test wherein the quality and/or the reliability of the component is determined based on a dynamic behavior in the measured variable of the component when the component is under the test conditions.

* * * * *